US006713676B2

(12) United States Patent
Fischer

(10) Patent No.: US 6,713,676 B2
(45) Date of Patent: Mar. 30, 2004

(54) SYSTEM AND METHOD FOR CONVERTING A DC INPUT VOLTAGE TO A DC OUTPUT VOLTAGE

(75) Inventor: Klaus Fischer, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 42 days.

(21) Appl. No.: 09/993,784

(22) Filed: Nov. 14, 2001

(65) Prior Publication Data

US 2002/0074145 A1 Jun. 20, 2002

Related U.S. Application Data

(60) Provisional application No. 60/249,183, filed on Nov. 15, 2000.

(51) Int. Cl.⁷ .............................................. H01L 23/02
(52) U.S. Cl. ..................... 174/52.2; 174/52.4; 174/52.5; 336/96
(58) Field of Search ............................... 174/52.2, 52.4, 174/52.5; 361/782; 257/787; 336/96

(56) References Cited

U.S. PATENT DOCUMENTS 4,780,795 A * 10/1988 Meinel ........................ 361/402
5,010,314 A * 4/1991 Estrov ......................... 336/198
5,815,381 A    9/1998 Newlin ......................... 363/17

OTHER PUBLICATIONS

"Isolated 1W Single Output SM DC–DC Converters," NTE Series, *Newport Components*, issue 4, Dec. 1999, DCR 2446.

* cited by examiner

*Primary Examiner*—Hung V. Ngo
(74) *Attorney, Agent, or Firm*—Yingsheng Tung; Wade James Brady, III; Frederick J. Telecky, Jr.

(57) ABSTRACT

A system for converting a DC input voltage to a DC output voltage includes at least one integrated circuit die electrically coupled to a leadframe. An inductor is also coupled to the leadframe and electrically coupled to the integrated circuit die. An inductor casing generally surrounds the inductor, and a molding encapsulates the integrated circuit die, a portion of the leadframe, and a portion of the inductor. The integrated circuit die and the inductor are operable to receive the direct current input voltage and to convert the direct current input voltage to the direct current output voltage.

20 Claims, 2 Drawing Sheets

SYSTEM AND METHOD FOR CONVERTING A DC INPUT VOLTAGE TO A DC OUTPUT VOLTAGE

This application claims priority under 35 USC §119(e)(1) of provisional application number 60/249,183 filed Nov. 15, 2000.

TECHNICAL FIELD OF THE INVENTION

This invention relates generally to the field of electronic devices and, more specifically, to a system and method for converting a DC input voltage to a DC output voltage.

BACKGROUND OF THE INVENTION

DC—DC converter systems are used to convert a direct current ("DC") input voltage to a direct current ("DC") output voltage that is normally at a different magnitude than the DC input voltage. There is two basic types of DC—DC converters: Buck and Boost converters. The Buck converter produces a lower DC output voltage from a higher input voltage, and the Boost converter produces a higher DC output voltage from a lower DC input voltage. Many Boost converters are used in portable applications such as DSP applications for cell phones where space and printed circuit board area is a premium concern. Therefore, it is desired that DC—DC converter systems be small in addition to being reliable and manufactured at low cost.

Some DC—DC converter systems are manufactured using printed circuit boards. An integrated circuit and inductor used for these converter circuits are discrete components, which requires a large amount of space as well as higher cost due to increased material needs and manufacturing steps. Another problem with manufacturing DC—DC converter systems using printed circuit boards is that the traces on printed circuit boards caused radio jamming because of the high frequency signals the traces carry. Dual in-line package ("DIP") integrated circuits have been recently developed to address some of the problems of printed circuit board DC—DC conversion systems. These DIP's address a few of the problems of printed circuit board applications by reducing the space needed as well as reducing the electromagnetic interference associated with printed circuit board methods. However, these DIP solutions can be expensive to manufacture and can be limited in their performance because of the non-ideal magnetic properties of their inductors.

SUMMARY OF THE INVENTION

The challenges in the field of electronic devices continue to increase with demands for more and better techniques having greater flexibility and adaptability. Therefore, a need has arisen for a new system and method for converting a DC input voltage to a DC output voltage.

In accordance with the present invention, a system and method for converting a DC input voltage to a DC output voltage is provided that addresses disadvantages and problems associated with previously developed systems and methods.

A system for converting a DC input voltage to a DC output voltage includes at least one integrated circuit die electrically coupled to a leadframe. An inductor is also coupled to the leadframe and electrically coupled to the integrated circuit die. An inductor casing generally surrounds the inductor, and a molding encapsulates the integrated circuit die, a portion of the leadframe, and a portion of the inductor. The integrated circuit die and the inductor are operable to receive the direct current input voltage and to convert the direct current input voltage to the direct current output voltage.

A method for converting a DC input voltage to a DC output voltage includes bonding at least one integrated circuit die to a leadframe, and electrically coupling the integrated circuit die to the leadframe. The method further includes coupling an inductor to the leadframe, and electrically coupling the inductor to the integrated circuit die. The method also includes generally surrounding the inductor with an inductor casing, and encapsulating the integrated circuit die, a portion of the leadframe, and a portion of the inductor with a molding. In addition, the method includes receiving the direct current input voltage and converting the direct current input voltage to the direct current output voltage.

Embodiments of the invention provide numerous technical advantages. For example, a technical advantage of one embodiment of the present invention is that less space is needed for the DC—DC converter system, which allows new applications such as small portable DSP applications. Another technical advantage of one embodiment of the present invention is that the design of DC—DC converter solutions becomes easier for the end user because selection of the inductor and integrated circuit die is already performed before being shipped to the end user. A further technical advantage of one embodiment of the present invention is that there is less electromagnetic interference associated with the DC—DC converter system because there are no traces between the coil and integrated circuit on a printed circuit board that carry high frequency signals. A still further technical advantage of one embodiment of the present invention is that there is a reduction in total costs for the DC—DC converter system because of less fabrication steps and less material needs.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EMBODIMENTS OF THE INVENTION

Figure 1:
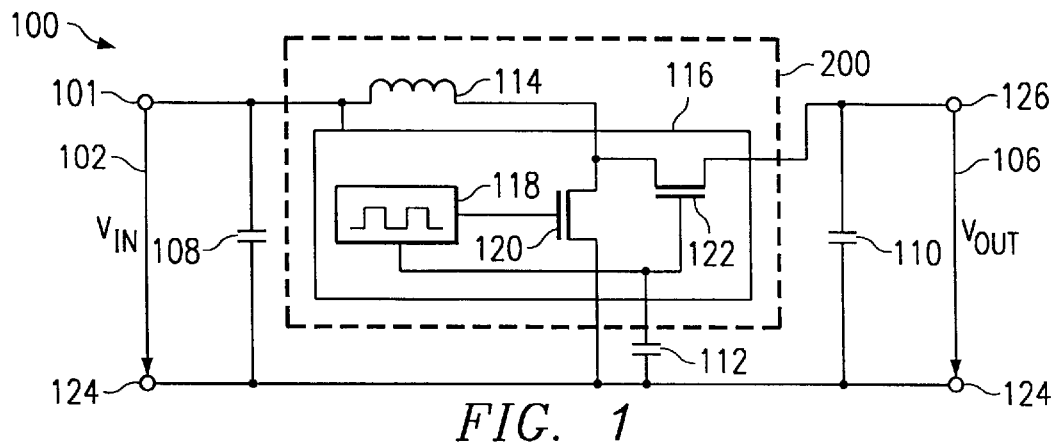
FIG. 1 is a schematic diagram illustrating one embodiment of a system for converting a DC input voltage to a DC output voltage in accordance with the present invention.
Figure 2:
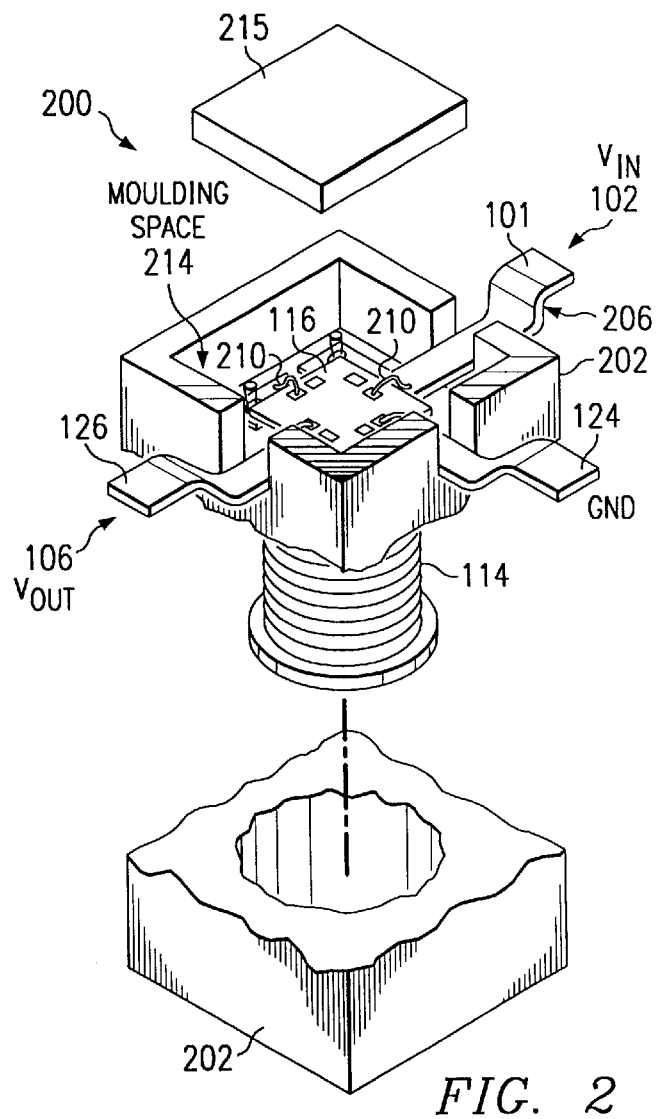
FIG. 2 is a partially exploded perspective view illustrating one embodiment of a DC—DC converter package in accordance with the present invention.
Figure 3:
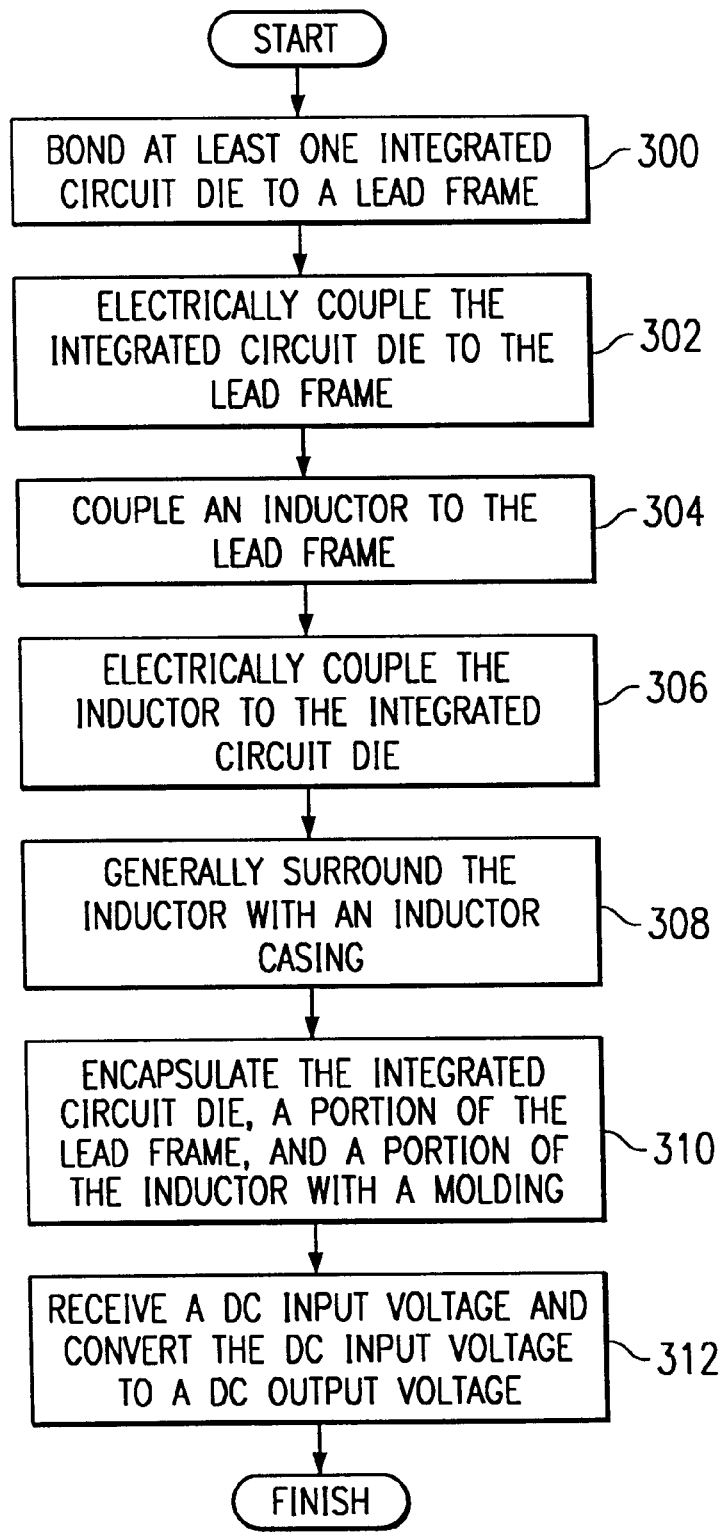
FIG. 3 is a flowchart demonstrating one method of converting a DC input voltage to a DC output voltage in accordance with the present invention.

Embodiments of the present invention and their advantages are best understood by referring now to FIGS. 1–3 of the drawings, in which like numerals refer to like parts.

FIG. 1 is a schematic diagram illustrating one embodiment of a DC—DC converter system 100 in accordance with the present invention. DC—DC converter systems are used to convert a DC input voltage to a DC output voltage that is normally at a different magnitude than the DC input voltage.

DC—DC converter system 100 includes a DC input lead 101, an input capacitor 108, an inductor 114, an integrated circuit die 116, an output capacitor 110, a compensation capacitor 112, and a DC output lead 126. FIG. 1 shows integrated circuit die 116 having a logic circuitry 118, a first transistor 120, and a second transistor 122.

An input of inductor 114 is electrically coupled to DC input lead 101 and receives a DC input voltage 102 thereby generating a current through inductor 114. Because of the current through inductor 114, inductor 114 is loaded with magnetic energy. This magnetic energy induces a current that charges up output capacitor 110 and produces DC output voltage 106 at DC output lead 126. Logic circuitry 118 regulates DC output voltage 106 by determining the maximum current for inductor 114 and switching first transistor 120 and second transistor 122 off when inductor 114 is loaded with sufficient magnetic energy. When DC output voltage 106 decreases below a desired value, first transistor 120 and second transistor 122 are switched on again by logic circuitry 118 so inductor 114 can be re-loaded with magnetic energy thereby increasing DC output voltage 106 to the desired level.

One implementation of DC—DC converter system 100 involves forming all components of system 100 separately on a printed circuit board. However, using a printed circuit board results in the use of discrete components with traces electrically coupling the components. Having discrete components requires a large amount of space and results in higher cost due to increased material needs and manufacturing steps. In addition, the traces on printed circuit boards cause radio jamming because of high frequency signals carried by the traces. The present invention addresses these problems, in one embodiment, by integrating inductor 114 and integrated circuit die 116 into a DC—DC converter package 200 as shown best in FIG. 2.

FIG. 2 is a partially exploded perspective view illustrating one embodiment of DC—DC converter package 200 in accordance with the present invention. DC—DC converter package 200 includes an inductor casing 202, inductor 114, a leadframe 206, integrated circuit die 116, bonding wires 210, and a molding space 214 for a molding 215. Incorporating both inductor 114 and integrated circuit die into DC—DC converter package 200 results in reduced space requirements for the resulting DC—DC converter system, which allows for development of new applications such as small portable DSP applications. Such a system also results in reduced electromagnetic interference associated with DC—DC converter package 200 because, in this embodiment, traces on a printed circuit board carrying high frequency signals are eliminated.

Inductor casing 202 is the packaging material for inductor 114. In one embodiment, inductor casing 202 is a ferrite material; however, inductor casing 202 may be other types of packaging material, such as other types of metal or metal alloys with good magnetic properties. Ferrite has excellent magnetic properties and allows for a higher inductance for inductor 114, which results in the ability of inductor 114 to store more magnetic energy.

Inductor 114 is used in DC—DC converter system 100 for charging up output capacitor 110. In one embodiment, inductor 114 is a single coil inductor; however, any type of inductor with any suitable number of coils or windings may be used. As shown in FIG. 2, coupling inductor 114 to leadframe 206 may be accomplished by extending ends of inductor 114 through openings in leadframe 206 and attaching via any suitable method, such as welding or other fastening techniques used in electronic device fabrication.

In one embodiment, leadframe 206 is configured as shown in FIG. 2 with DC input lead 101, DC output lead 126, and a ground lead 224. However, any suitable size and configuration leadframe may be used depending on the design requirements for DC—DC converter system 100. In the embodiment shown in FIG. 2, DC input lead 101 is operable to receive DC input voltage 102, DC output lead 126 is operable to send DC output voltage 106, and ground lead 224 is connected to ground. Leadframe 206 may include other leads such as, for example, a lead for compensation capacitor 112, which is discussed below. Any type of material suitable for forming leadframes may be used for leadframe 206. In one embodiment, leadframe 206 is a metallic leadframe with a center portion configured to accept at least one integrated circuit die 116.

Integrated circuit die 116 may be any type of integrated circuit die with circuitry to aid in the conversion of one DC voltage to another DC voltage. As discussed above, integrated circuit die 116 includes logic circuitry 118, first transistor 120, and second transistor 122. However, integrated circuit die 116 may include other components, such as oscillation circuitry, watchdog circuitry, or low-battery indicator circuitry. One or any number of integrated circuit dies may be coupled to leadframe 206. In one embodiment, integrated circuit die 116 is adhesively bonded to leadframe 206; however, other suitable methods of attachment may be used. After coupling integrated circuit die 116 to leadframe 206, integrated circuit die 116 is electrically connected to leadframe 206 with bonding wires 210. Bonding wires 210 are connected from various contact points on integrated circuit die 116 to desired locations on leadframe 206. Some bonding wires 210 electrically connect integrated circuit die 116 to ends of inductor 114. Bonding wires 210 may be any suitable conductive wires used in integrated circuit manufacturing.

After all electrical connections are complete, DC—DC converter package 200 is completed by filling in molding space 214 with molding 215. In one embodiment, molding 215 is an epoxy; however, molding 215 may be other suitable types of material, such as plastic or ceramic. Molding 215 provides physical protection for the underlying circuitry and connections from moisture and other contaminants.

Referring back to FIG. 1, compensation capacitor 112 is shown to be electrically coupled to DC—DC converter package 200. Compensation capacitor 112 may or may not be utilized depending on the type of DC—DC conversion system desired. Compensation is necessary for some DC—DC conversion systems for the stability of the output voltage. If compensation capacitor 112 exists externally to DC—DC converter package 200, then leadframe 206 has at least one extra lead. However, if internal, then integrated circuit die 116 contains compensation capacitor 112.

Input capacitor 108 and output capacitor 110 are illustrated in FIG. 1 as being separate from DC—DC converter package 200; however, according to the teachings of the present invention, input capacitor 108 and output capacitor 110 may be formed in integrated circuit die 116. If separate from DC—DC converter package 200, then input capacitor 108 and output capacitor 110 may take the form of discrete components on a printed circuit board that are electrically connected to integrated circuit die 116.

FIG. 3 is a flowchart demonstrating one method of converting DC input voltage 102 to DC output voltage 106 in accordance with the present invention. At least one integrated circuit die 116 is bonded to leadframe 206 at step 300. Integrated circuit die 116 may be any type of integrated circuit die with suitable circuitry to aid in the conversion of one DC voltage to another DC voltage. Integrated circuit die 116 is electrically coupled to leadframe 206 at step 302, while inductor 114 is coupled to leadframe 206 at step 304. Inductor 114 is also electrically coupled to integrated die 208 at step 306. Inductor 114 is generally surrounded by inductor casing 202 at step 308. In one embodiment, inductor casing 202 is formed from ferrite. Integrated circuit die 116, a portion of leadframe 206, and a portion of inductor 114 is encapsulated with molding 215 at step 310. DC—DC converter package 200 receives DC input voltage 102 through DC input lead 101 and converts DC input voltage 102 to DC output voltage 106 at step 312. DC input voltage 102 is either boosted (i.e., increased) or bucked (i.e., reduced) to DC output voltage 106.

Although embodiments of the invention and their advantages are described in detail, a person skilled in the art could make various alternations, additions, and omissions without departing from the spirit and scope of the present invention as defined by the appended claims.

What is claimed is:

1. A system for converting a direct current input voltage to a direct current output voltage, comprising:
    at least one integrated circuit die electrically coupled to a leadframe;
    an inductor coupled to the leadframe and electrically coupled to the integrated circuit die;
    an inductor casing generally surrounding the inductor;
    a molding encapsulating the integrated circuit die, a portion of the leadframe, and a portion of the inductor; and
    wherein the integrated circuit die and the inductor are operable to receive the direct current input voltage and to convert the direct current input voltage to the direct current output voltage.

2. The system of claim 1, further comprising a compensation capacitor electrically connected to the integrated circuit die.

3. The system of claim 1, further comprising an input capacitor and an output capacitor electrically connected to the integrated circuit die.

4. The system of claim 1, wherein the inductor casing is formed from ferrite.

5. The system of claim 1, wherein the integrated circuit die is adhesively bonded to the leadframe.

6. The system of claim 1, wherein the integrated circuit die and the inductor are operable to receive the DC input voltage and to boost the DC input voltage to the DC output voltage.

7. The system of claim 1, wherein the integrated circuit die and the inductor are operable to receive the DC input voltage and to reduce the DC input voltage to the DC output voltage.

8. A system for converting a direct current input voltage to a direct current output voltage, comprising:
    a ferrite inductor casing;
    an inductor generally surrounded by the ferrite inductor casing;
    a leadframe having an input lead, an output lead, and a ground lead mounted on the ferrite inductor casing, the leadframe coupled to the inductor;
    at least one integrated circuit die bonded to a center portion of the leadframe;
    bonding wires electrically coupling the integrated circuit die to the input lead, the output lead, the ground lead, and the inductor;
    a molding encapsulating the integrated circuit die, the bonding wires, the center portion of the leadframe, and a portion of the inductor; and
    wherein the integrated circuit die and inductor are operable to receive the direct current input voltage, to convert the direct current input voltage to the direct current output voltage, and to output the direct current output voltage.

9. The system of claim 8, further comprising a compensation capacitor electrically connected to the integrated circuit die.

10. The system of claim 8, further comprising an input capacitor and an output capacitor electrically connected to the integrated circuit die.

11. The system of claim 8, wherein the integrated circuit die is adhesively bonded to the leadframe.

12. The system of claim 8, wherein the integrated circuit die and the inductor are operable to receive the direct current input voltage and to boost the direct current input voltage to the direct current output voltage.

13. The system of claim 8, wherein the integrated circuit die and the inductor are operable to receive the direct current input voltage and to reduce the direct current input voltage to the direct current output voltage.

14. A method for converting a direct current input voltage to a direct current output voltage, the method comprising:
    bonding at least one integrated circuit die to a leadframe;
    electrically coupling the integrated circuit die to the leadframe;
    coupling an inductor to the leadframe;
    electrically coupling the inductor to the integrated circuit die;
    generally surrounding the inductor with an inductor casing;
    encapsulating the integrated circuit die, a portion of the leadframe, and a portion of the inductor with a molding; and
    receiving the direct current input voltage and converting the direct current input voltage to the direct current output voltage.

15. The method of claim 14, further comprising electrically connecting a compensation capacitor to the integrated circuit die.

16. The method of claim 14, further comprising electrically connecting an input capacitor and an output capacitor to the integrated circuit die.

17. The method of claim 14, wherein generally surrounding the inductor with an inductor casing comprises generally surrounding the inductor with an inductor casing formed from ferrite.

18. The method of claim 14, wherein bonding comprises adhesively bonding.

19. The method of claim 14, wherein converting the direct current input voltage to the direct current output voltage comprises boosting the direct current input voltage to the direct current output voltage.

20. The method of claim 14, wherein converting the direct current input voltage to the direct current output voltage comprises reducing the direct current input voltage to the direct current output voltage.

* * * * *